United States Patent [19]

Sevillano et al.

[11] Patent Number: 5,405,645
[45] Date of Patent: Apr. 11, 1995

[54] HIGH GROWTH RATE PLASMA DIAMOND DEPOSITION PROCESS AND METHOD OF CONTROLLING SAME

[75] Inventors: Evelio Sevillano, Lexington; Lawrence P. Bourget, Winchester; Richard S. Post, Lexington, all of Mass.

[73] Assignee: Applied Science and Technology Inc., Woburn, Mass.

[21] Appl. No.: 98,958

[22] Filed: Jul. 28, 1993

[51] Int. Cl.⁶ .............................................. C23C 16/50
[52] U.S. Cl. .................................... 427/10; 427/575; 427/577
[58] Field of Search ................... 427/249, 255.1, 577, 427/575, 10

[56] References Cited

U.S. PATENT DOCUMENTS 4,816,286  3/1989  Hirose .............................. 427/255.1
4,937,095  6/1990  Fukatsu et al. ................... 427/255.5
4,957,591  9/1990  Sato et al. ........................ 427/535
5,110,577  5/1992  Tamor et al. ..................... 427/255.1

*Primary Examiner*—Shrive Beck
*Assistant Examiner*—Bret Chen
*Attorney, Agent, or Firm*—Joseph S. Iandiorio; Kirk Teska; Iandiorio and Teska

[57] ABSTRACT

A process for depositing diamond on a substrate using a microwave plasma generator including providing carbon, hydrogen and oxygen in a desired ratio to the microwave plasma generator, and providing sufficient microwave power to the microwave plasma generator to produce a greenish-colored plasma with the $C_2$ emission at 5165 Angstroms (Å) at a level of from 0.5 to 50 times the atomic hydrogen alpha emission level at 6563 Å, for depositing high quality diamond at an extremely high rate on the substrate placed proximate or in the plasma.

9 Claims, 5 Drawing Sheets

5,405,645

HIGH GROWTH RATE PLASMA DIAMOND DEPOSITION PROCESS AND METHOD OF CONTROLLING SAME

GOVERNMENT RIGHTS

This material is based upon work supported by the National Science Foundation under Grant Number ISI-9060510. The government has certain rights in this material.

FIELD OF INVENTION

This invention relates to a high growth rate microwave plasma diamond deposition process that deposits high quality diamond films at growth rates an order of magnitude or more greater than presently available microwave plasma diamond deposition processes.

BACKGROUND OF INVENTION

There has been much effort made of late in the field of commercial production of diamond. There are many high pressure processes such as plasma torches that deposit diamond on only a very small surface area. If the flame is spread out over a large surface area, the diamond quality suffers dramatically. Of the different techniques, microwave plasma enhanced chemical vapor deposition has produced the highest quality diamond films over acceptable surface areas.

Most such microwave plasma enhanced CVD processes operate at total microwave power of approximately 1,500 watts and at pressures of tip to 50 Torr. The feed gas is typically a dilute hydrocarbon, for example 1% to 5% methane. Sometimes, small amounts of oxygen are added to the feed gas. Such systems deposit diamond at growth rates of about 2 microns per hour. However, such low deposition rates have kept the process from becoming commercially feasible.

SUMMARY OF INVENTION

It is therefore an object of this invention to provide a microwave enhanced diamond deposition process that deposits diamond at an extremely high rate.

It is a further object of this invention to provide such a process which deposits high quality diamond films at a high mass deposition rate.

It is a further object of this invention to provide such a process which can deposit diamond at high growth rates over relatively large surface areas.

This invention results from the realization that an extremely high growth rate microwave plasma enhanced chemical vapor deposition process may be accomplished by increasing the microwave power density in the plasma to achieve thermal plasma conditions characterized by a great increase in the relative concentration of $C_2$ radicals in the plasma. The presence of $C_2$ radicals is a result of chemical reactions among two C species.

This invention may be accomplished in a process for depositing diamond on a substrate using a deposition reactor such as a microwave plasma generator contemplating providing carbon, hydrogen and a graphitic etchant such as oxygen or a halogen in desired a ratio to the deposition reactor, and providing sufficient microwave power to the reactor to produce a greenish-colored plasma emitting at a $C_2/H_{60}$ emission ratio of from 0.5 to 50 for depositing diamond on a substrate placed proximate or in the plasma. In one embodiment, the carbon, hydrogen and oxygen are provided as gasses, for example methane and oxygen at a desired ratio. In another embodiment, the substances are provided through evaporation of liquids and/or sputtering of solids. Acetone or another substance having C/H/O may be used in some instances and water may also be used in other instances.

Preferably, the spectral emissions of the plasma are monitored with a device such as a spectrometer. In that case, the process may contemplate resolving the relative intensity of $C_2$ emissions as well as the relative intensity of $H_\alpha$ emissions. Preferably, the $C_2/H_\alpha$ ratio is monitored and at least one of the carbon, hydrogen and oxygen ratio, and the microwave power, is then adjusted to achieve a desired $C_2/H_\alpha$ ratio. That ratio is preferably held from between 1.0 and 10.0. The spectral emissions are preferably monitored through the center of the plasma rather than at its edges.

The process contemplates employing a desired microwave power level. Preferably, the power is held at from 0.2 kilowatts (kW) per square centimeter to 5 kW per square centimeter substrate deposition area. In one embodiment, the total power is tip to 3 megawatts (MW). The process preferably also contemplates controlling the pressure in the microwave plasma generator. The plasma generator is preferably operated in the diffusion regime. The pressure may be held between 10 Torr and 1 atmosphere, and is preferably between 50 and 200 Torr.

DISCLOSURE OF PREFERRED EMBODIMENT

Other objects, features and advantages will occur to those skilled in the art from the following description of a preferred embodiment and the accompanying drawings in which.

This invention may be accomplished with a process for depositing diamond on a substrate using a deposition reactor such as a microwave plasma generator. The process contemplates providing carbon, hydrogen and a graphitic etchant such as oxygen or one or more of the halogens in a desired ratio to the reactor, and providing sufficient microwave power to the reactor to produce a greenish-colored plasma with a $C_2$ emission intensity of from ½ to 50 times the $H_\alpha$ emission intensity. The intensity ratio is calculated by taking the ratio of the emission intensity from the (0,0) transition of the $C_2$ radical which emits at 5165 Å to the intensity of the $H_\alpha$ line at 6563 Å. The spectral measurements are taken with a spectrometer from Acton Research Corporation, Model SpectraPro 275, with entrance and exit slits adjusted to 10 μm; a fiber optic light guide, Model LG-455 for the wavelength range of 1900 Å to 1.1 μm, also from Acton Research Corporation; and a photomultiplier tube, Model R928, from Hamamatsu Corporation. The grating on the spectrometer is blazed at 5000 Å with 1200 grooves per millimeter. The intensity of the $H_\alpha$ line is corrected to take into account the decreased transmission of the spectrometer and the relative gains of the photomultiplier at the wavelength of the lines measured.

Figure 1:
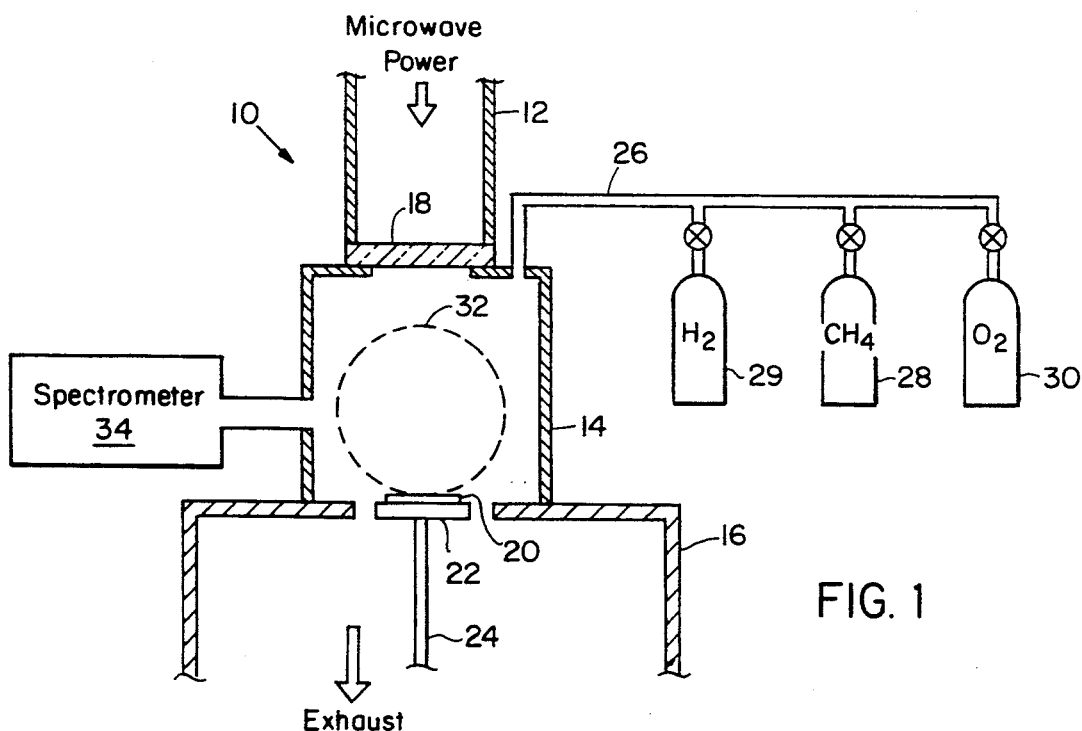
FIG. 1 is a schematic diagram of a microwave plasma deposition system for practicing the process of this invention.

There is shown in FIG. 1 microwave plasma generator 10 which may be used to practice the process of this invention. Device 10 includes circular cross-section waveguide 12 for carrying microwave energy to circular cross-section plasma chamber 14 coupled to waveguide 12 through dielectric window 18. Substrate chamber 16 also serves as an exhaust chamber by tile application of an exhaust pump, not shown. The microwave plasma generator shown here is known in the art; one example of a commercially available device which has been used to successfully practice this invention is the model AX5400 microwave plasma generator which includes a model A-5000 5 kW microwave power source both available from Applied Science and Technology, Woburn, Mass.

Substrate 20, which is typically a silicon substrate as known in the art, is held on stage 20 which may be moved in and out of plasma chamber 14 as desired through rod 24. Sources of feed gas 28, 29 and 30, in this example methane, hydrogen and oxygen, respectively, provide a source of carbon, hydrogen and oxygen to chamber 14 through line 26. Chamber 14 is kept at 10 Torr to 1 atmosphere, preferably 50 to 200 Torr, with a vacuum pump, not shown. The microwave power coupled to chamber 14 then forms generally spherical plasma 32 within the chamber for depositing diamond on substrate 20. The plasma shape is based on visual observation.

Spectrometer 34 is preferably used to monitor the bulk or center area of plasma ball 32 as opposed to the periphery or edges of the plasma. Substrate 20 is placed near or within plasma 32 to deposit diamond on its surface. Spectrometer 34 is preferably used to monitor the relative emission intensity of the $C_2$ band near 5165 Å, and the $H_\alpha$ peak at 6563 Å, as described previously. In the typical prior art microwave plasma generator systems operating at perhaps 1,500 watts, 40 Torr and 1% methane (the balance $H_2$), there is no significant (above background) emission of molecular carbon ($C_2$), while there is a significant emission in the Balmer series, such as from $H_\alpha$. This type of plasma has an orange-bluish color from the hydrogen Balmer series emissions, including the $H_\alpha$ emission at 6563 Å and the $H_\beta$ emission at 4861 Å.

Figure 2:
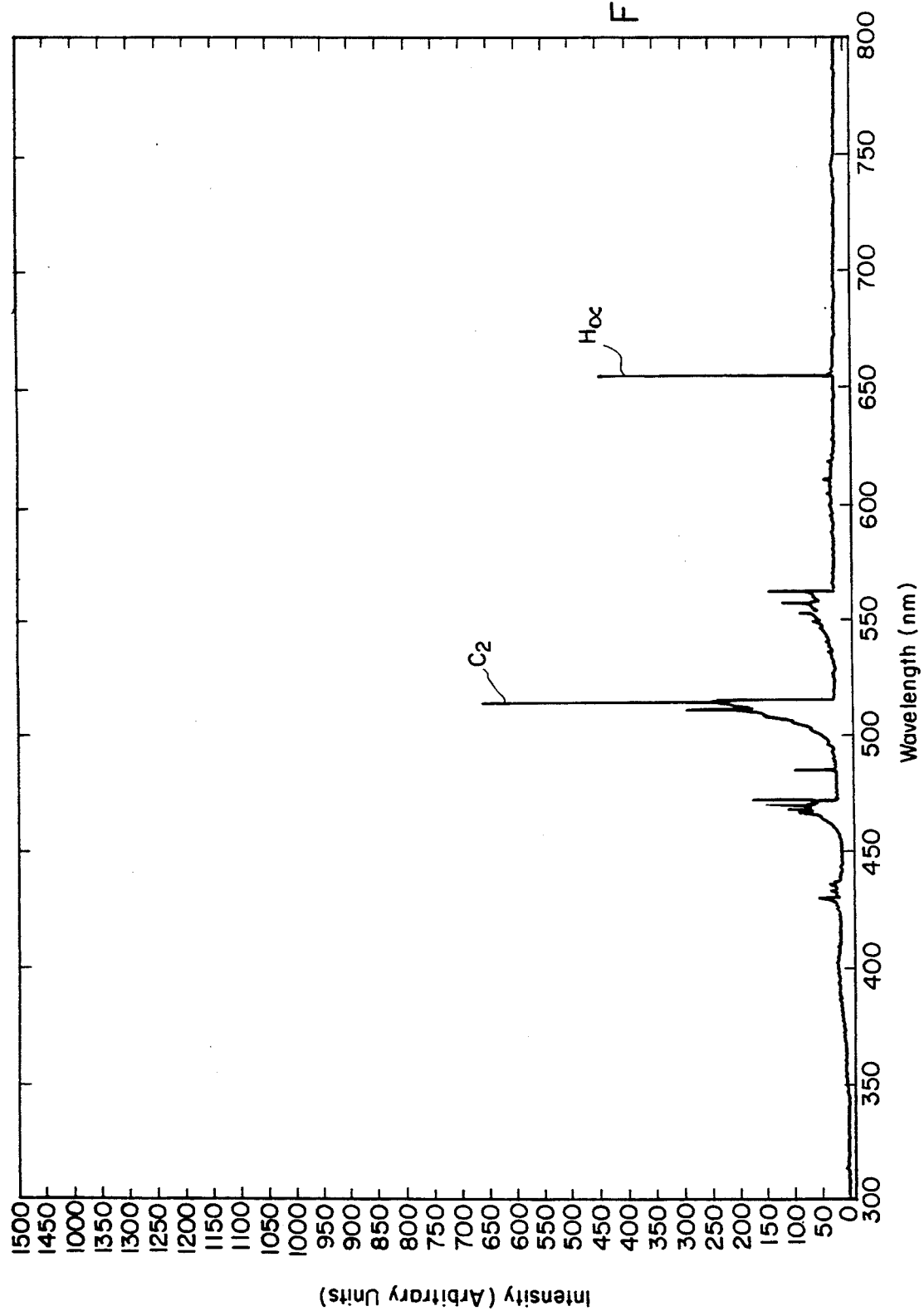
FIG. 2 is a graph of the spectral emission of a plasma produced according to the process of this invention illustrating the great increase in $C_2$ radicals present in the plasma as evidenced by the emission from the Swan bands near 4737 Å, 5165 Å, and 5636 Å.

In contrast, a typical spectral emission of the process of this invention is shown in FIG. 2. This data was generated for a discharge at 5,000 watts an $H_2$ flow of 200 sccm, $CH_4$ flow of 30 sccm, and $O_2$ flow of 3 sccm, at 100 Torr. The strong lines in the green near 5165 Å were molecular carbon lines ($C_2$). Other $C_2$ lines were observed at 4737 Å and 5636 Å. Radiation from $H_\alpha$ was observed at 6563 Å and $H_\beta$ at 4861 Å. As can be seen, the relative intensity of $C_2$ was greater than that of $H_\alpha$. It has been found, however, that sufficient $C_2$ present in the plasma is indicative of the increased deposition rate of this invention. Sufficient $C_2$ exists when the $C_2/H_\alpha$ ratio is from 0.5 to 50, and more preferably from 1.0 to 10.0, with a ratio of around 1 having been found to be indicative of a plasma at a temperature for deposition of diamond at a high mass deposition rate (>10 mg/hr). Under these conditions, sufficient atomic hydrogen is present to result in a high-quality, low graphitic-content diamond film product. The presence of $C_2$ radicals is a consequence of the high power density in the discharge which is key to the high diamond mass deposition rate. At the high power densities that are established, the reactions which involve more than one carbon species are driven to completion and, as a consequence, a large increase in $C_2$ emission is obtained.

The plasma conditions indicative of the high diamond mass growth rate regime (>10 mg/hr peak growth rate) have been found to occur at a $C_2/H_\alpha$ ratio of from 0.5 to 50. It is theorized that the increase of $C_2$ radicals above the background emission levels found in known plasma conditions is a result of the high power density in the plasma which allows reactions which involve more than one carbon-containing species to occur. Under these high power density conditions, there is also an increase in the atomic hydrogen concentration which exists in the plasma. When the process conditions are changed from those previously known at which there is no measurable $C_2$ emission to those of the present invention, it has been found that the $C_2$ concentration may increase by up to 5 orders of magnitude, while the growth rate increases approximately 1 order of magnitude. It has also been noted that the concentration of $CH_3$ radicals and atomic hydrogen in the same plasma increases approximately an order of magnitude, leading to the conclusion that the $CH_3$ radicals may be responsible for the diamond deposition while there are sufficient H atoms to maintain the high quality of the diamond. However, the increased $C_2$ levels are clearly indicative of plasma conditions that lead to this dramatically increased deposition rate.

In operating the system of FIG. 1, the variables which may be adjusted to achieve the desired plasma conditions are the plasma power density, the substrate temperature, the gas mixture, the mass flow rate, and the operating pressure. The power density herein is defined as follows. The diamond deposition typically occurs at the fastest rate at the center of the substrate where the plasma ball is closest to the substrate. The cross sectional profile of the deposited diamond is generally Gaussian. If the 1/e thickness location of the thickness profile is taken as R, the substrate deposition area is then $\pi R^2$ for an axisymmetric spherical plasma. The power densities described herein have been calculated by dividing the total microwave power coupled to the plasma by $\pi R^2$. To obtain the high $C_2$ concentrations and therefore the high diamond mass growth rates of this invention, power densities in the range of 0.2 to 5 kW per square centimeter are required. If the diamond mass deposition rate is tracked along with total power, the relationship between the two is nonlinear. For example, the total diamond mass deposition rate went from 3 mg/hour at 1500 W to 60 mg/hour at 5000 W.

Figure 4:
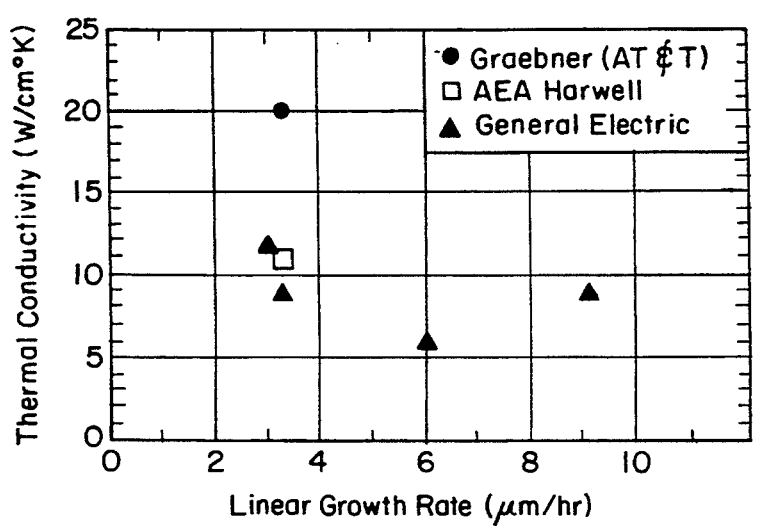
FIG. 4 is a graph of thermal conductivity measurements for diamond material grown using the process of this invention at different deposition rates.
Figure 3:
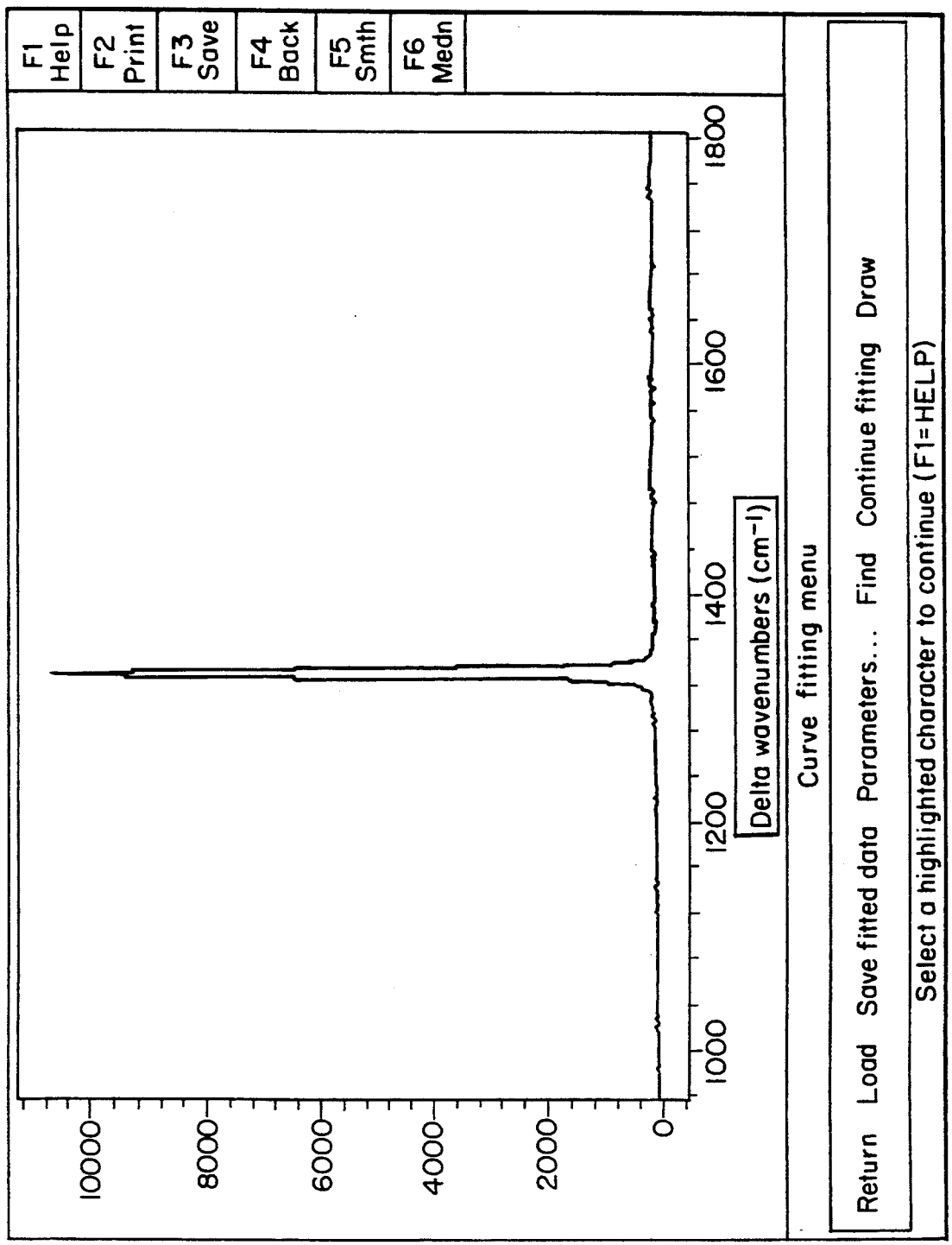
FIG. 3 is a graph of the Raman scattering from a high quality diamond film obtained by the process of this invention.

The quality of the diamond deposited by the process of this invention is typically characterized by intense Raman scattering at 1332 cm$^{-1}$, with a thermal conductivity ($\kappa$) of greater than about 2.5 W/cm° C. and growth rate at the peak of the thickness profile of greater than 1 micron/hour. The color can be from black to clear. In FIG. 3 the Raman scattering from a high quality diamond film obtained using this process is shown. FIG. 4 shows thermal conductivity measurements for different diamond material grown using this process at different deposition rates. It is important from an economics standpoint to note that high thermal conductivity material is obtained even at the highest deposition rates shown in FIG. 4.

The range of C/H/O ratios which yield diamond deposition has been documented by Bachmann et al. *Diamond and Related Materials* 1 (1991), pages 1 though 12, (Elsevier Science Publishers, 1991). The species may be provided with hydrocarbons and a graphitic etchant such as oxygen or one or more of the halogens. The species may also be provided in other forms such as by supplying acetone or other substances containing carbon, hydrogen and oxygen which may be supplied as solids, liquids, or gases. For example, solids may be sputtered into the plasma volume and the liquids may be evaporated into the volume to provide the species at the location where the power is coupled to form the plasma. Additionally, the plasma may be formed by any of the known techniques such as microwave or RF excitation.

The following are two examples of diamond deposition processes according to this invention.

Example 1

Figure 5:
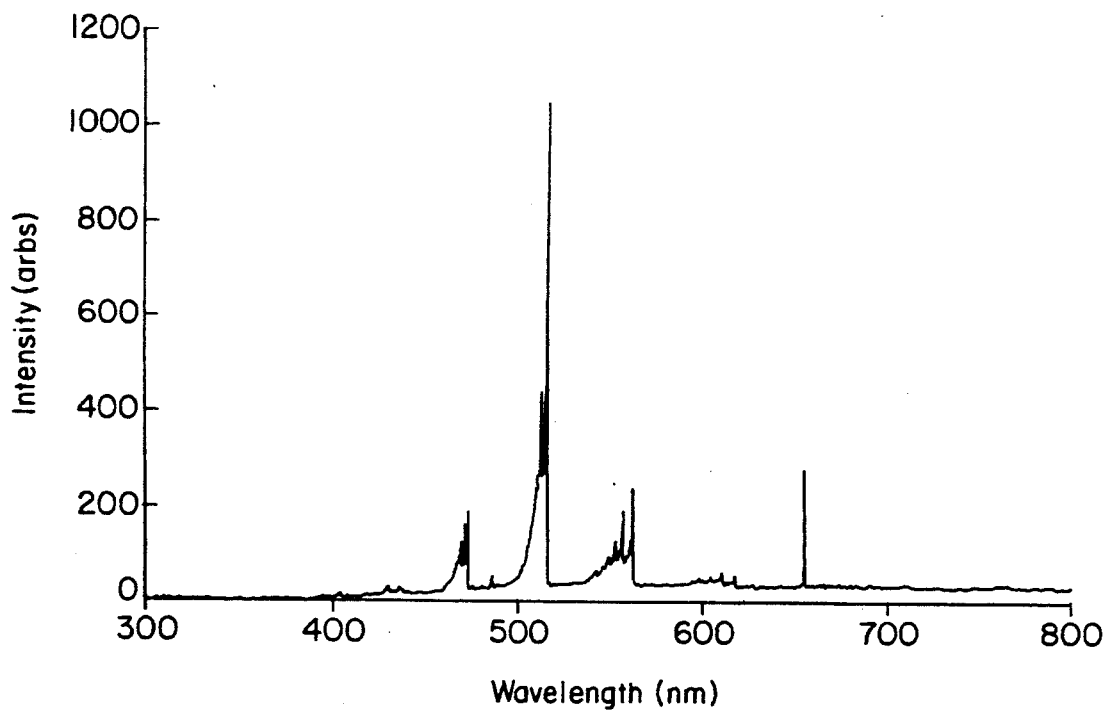
FIG. 5 is a graph of the emission spectrum for the process set forth in Example 1.

A gas mixture consisting of 717 sccm of hydrogen, 30 sccm of methane, and 3 sccm of oxygen (C/H/O ratio of 1.9/97.7/0.4) was used to grow high quality diamond at 5000 W, 110 Torr. The substrate temperature was 950° C. The observed mass deposition rate was 28 mg/hour. The emission spectrum from the plasma is shown in FIG. 5.

Example 2

Figure 6:
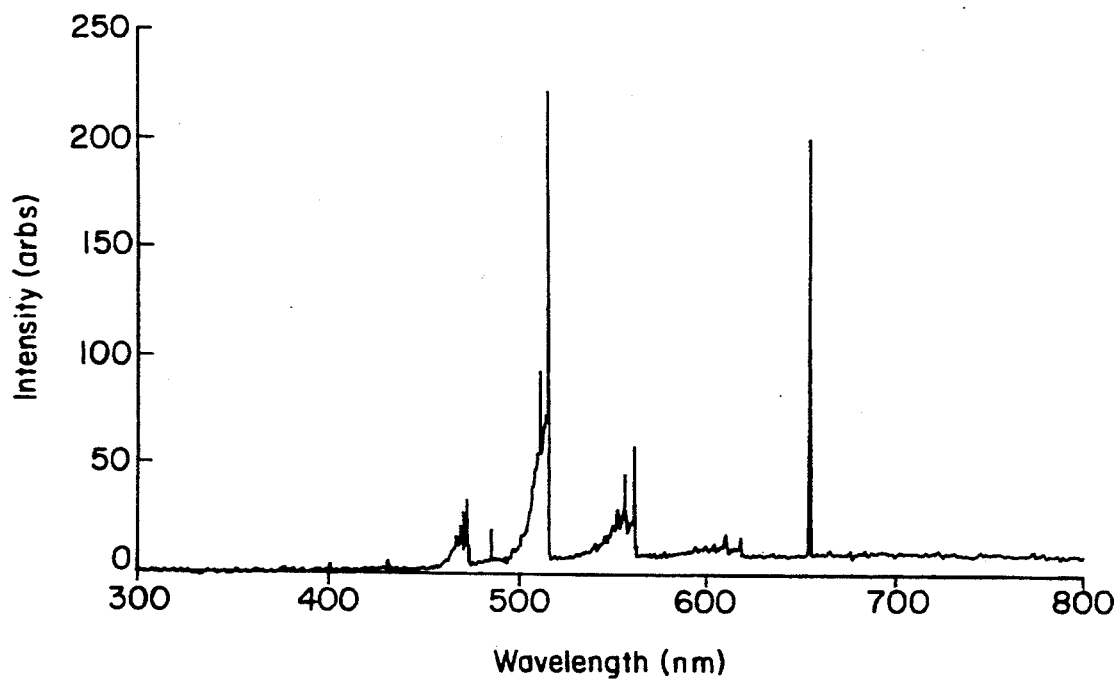
FIG. 6 is a graph of the emission spectrum for the process set forth in Example 2.

A gas mixture consisting of 200 sccm of hydrogen, 36 sccm of methane, and 5 sccm of oxygen (C/H/O ratio of 6.1/92.2/1.7) was used to grow high quality diamond at 5000 W, 120 Torr. The substrate temperature was 1020° C. The observed mass deposition rate was 95 mg/hour. The emission spectrum from the plasma is shown in FIG. 6.

Figure 7:
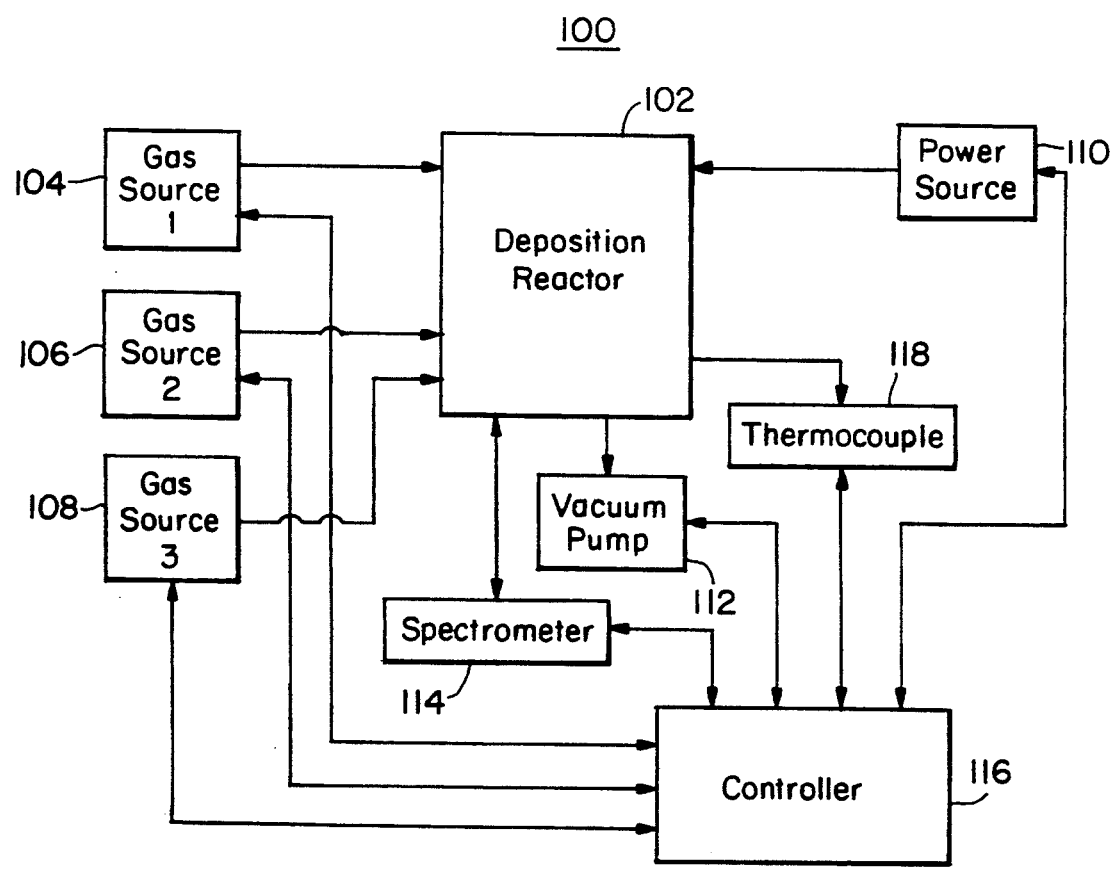
FIG. 7 is a schematic diagram of a process control system for use in this invention.

A schematic diagram of a system for controlling process conditions to maintain the desired plasma conditions is shown in FIG. 7. System 100 includes deposition reactor 102 that is fed from sources of carbon, hydrogen and a graphitic etchant such as oxygen or halogens or compounds of oxygen or halogens from gas sources 104, 106 and 108. Power supply or power source 110 and vacuum pump 112 maintain, in conjunction with control of gas pressure and flow rates, a desired operating pressure and mass flow rate through reactor 102. Spectrometer 114 is used to monitor the spectral emissions of the plasma. Thermocouple or pyrometer 118 is used to measure substrate temperature. Controller 116 is programmed to monitor the gas flow rates and pressures, the power coupled to the deposition reactor, the operation of the vacuum pump, the temperature of the substrate, and the spectral emissions of the plasma as determined by spectrometer 114 as defined above for providing an output such as shown in FIG. 2. Controller 116 may be enabled to measure the relative intensity of the $H_\alpha$ line at 6563 Å and the edge of the $C_2$ swan band at about 5165 Å, and determine the ratio between the two. Controller 116 may then be programmed to modify the gas flow rates, pressures, the amount of power, and/or the operating pressure to maintain the $C_2/H_\alpha$ ratio at a desired level between 0.5 and 50 to grow diamond at desired deposition rate and having a desired quality. The programming of controller 116 would be based on experimental data taken within the ranges described for creating a diamond having the desired characteristics such as Raman scattering line width, thermal conductivity and optical quality for the desired end use of the diamond product.

Although specific features of the invention are shown in some drawings and not others, this is for convenience only as some feature may be combined with any or all of the other features in accordance with the invention.

Other embodiments will occur to those skilled in the art and are within the following claims:

What is claimed is:

1. A process for depositing the diamond on a substrate using a microwave plasma generator, comprising:
   providing a continuous supply of carbon, hydrogen and graphite etchant to the microwave plasma generator;
   providing microwave power to the microwave plasma generator to produce a plasma which produces a $C_2$ and $H_\alpha$ spectral emissions;
   monitoring the intensity of the $C_2$ and $H_\alpha$ plasma spectral emissions continuously; and
   adjusting at least one of the continuous flow rates of carbon, hydrogen and oxygen, the microwave power, and the pressure in response to the intensity of the plasma's spectral emission to produce a plasma in which the $C_2/H_\alpha$ relative emission ratio is in the range of 0.5:1 to 50:1 to maximize the rate of diamond deposition on a substrate placed proximate to or within the plasma.

2. The diamond deposition process of claim 1 in which the pressure in the microwave plasma generator is controlled so as to maximize the rate of diamond deposition.

3. The diamond deposition process of claim 1 in which the desired $C_2/H_\alpha$ relative emission ratio is from 1.0:1 to 10.0:1.

4. The diamond deposition process of claim 1 in which monitoring the spectral emissions occurs at the center of the plasma.

5. The diamond deposition process of claim 1 in which the power density is from 0.2 kW/cm$^2$ to 5 kW/cm$^2$ in the substrate deposition area.

6. The diamond deposition process of claim 1 in which the power is provided at up to 3 MW.

7. The diamond deposition process of claim 2 in which the pressure is between 10 Torr and 1 atmosphere.

8. The diamond deposition process of claim 7 in which the pressure is between 50 and 200 Torr.

9. The diamond deposition process of claim 1 in which providing carbon, hydrogen and a graphitic etchant includes providing a compound including at least two of the three substances.

* * * * *